United States Patent
Wang et al.

(10) Patent No.: US 9,733,314 B2
(45) Date of Patent: Aug. 15, 2017

(54) METHOD AND SYSTEM FOR DETECTING LED SHORT CIRCUIT IN LED STRINGS OR DETECTING MATCHING AMONG LED STRINGS

(71) Applicant: Dialog Integrated Circuit (Tianjin) Limited, Tianjin (CN)

(72) Inventors: Nailong Wang, Beijing (CN); Guanou Yang, Beijing (CN); Yuwen Wang, Hayward, CA (US)

(73) Assignee: DIALOG INTEGRATED CIRCUITS (TIANJIN) LIMITED, Tianjin (CN)

(*) Notice: Subject to any disclaimer, the term of this patent is extended or adjusted under 35 U.S.C. 154(b) by 468 days.

(21) Appl. No.: 14/215,943

(22) Filed: Mar. 17, 2014

(65) Prior Publication Data

US 2014/0266217 A1    Sep. 18, 2014

(30) Foreign Application Priority Data

Mar. 18, 2013 (CN) .......................... 2013 1 0086406

(51) Int. Cl.
G01R 31/44 (2006.01)
G01R 31/02 (2006.01)
G01R 31/26 (2014.01)

(52) U.S. Cl.
CPC ........... *G01R 31/44* (2013.01); *G01R 31/025* (2013.01); *G01R 31/2635* (2013.01)

(58) Field of Classification Search
None
See application file for complete search history.

(56) References Cited

U.S. PATENT DOCUMENTS 8,610,368 B2* 12/2013 Lin .................... H05B 33/0827
                                                    315/185 S
8,907,568 B2* 12/2014 Jin .................... H05B 33/0815
                                                    315/120
(Continued)

FOREIGN PATENT DOCUMENTS

CN    102003689 A    4/2011
CN    102054442 A    5/2011
(Continued)

OTHER PUBLICATIONS

Chinese Office Action, Chinese Application No. 201310086406.4, Apr. 22, 2016, 10 pages. (with concise explanation of relevance).

*Primary Examiner* — Jermele M Hollington
*Assistant Examiner* — Suresh K Rajaputra
(74) *Attorney, Agent, or Firm* — Fenwick & West LLP

(57) ABSTRACT

This specification relates to a method and a system for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch. According to the present invention, first current of each of LED strings is obtained when the output end of the power supply outputs a first voltage; differences between the minimum of the first currents of LED strings and other first currents are calculated; the differences are compared with a comparing threshold; it is determined that the LED strings corresponding to the other currents for which differences are larger than the comparing threshold include short circuit or mismatch with the LED string corresponding to the minimum current. Accordingly, it is possible to reduce the number of pins and area of a control chip.

14 Claims, 7 Drawing Sheets

(56) References Cited

U.S. PATENT DOCUMENTS

| | | | | |
|---|---|---|---|---|
| 9,001,109 B2* | 4/2015 | Li | ............... | G09G 3/3406 345/102 |
| 9,001,482 B2* | 4/2015 | Chen | ............... | H02H 3/20 361/86 |
| 9,101,033 B2* | 8/2015 | Lin | ............... | H05B 33/089 |
| 2003/0160703 A1* | 8/2003 | Kurose | ............... | G09G 3/006 340/815.45 |
| 2007/0159750 A1* | 7/2007 | Peker | ............... | H05B 33/0869 361/93.1 |
| 2008/0122376 A1* | 5/2008 | Lys | ............... | H05B 33/0857 315/192 |
| 2008/0297067 A1* | 12/2008 | Wang | ............... | H05B 33/0815 315/294 |
| 2009/0273288 A1* | 11/2009 | Zhao | ............... | G09G 3/342 315/185 R |
| 2010/0026208 A1* | 2/2010 | Shteynberg | ............... | H05B 33/0815 315/297 |
| 2010/0156315 A1* | 6/2010 | Zhao | ............... | H05B 33/0818 315/294 |
| 2010/0201278 A1* | 8/2010 | Zhao | ............... | H05B 33/0815 315/185 R |
| 2010/0201279 A1* | 8/2010 | Zhao | ............... | H05B 33/0857 315/185 R |
| 2010/0308738 A1* | 12/2010 | Shteynberg | ............... | H05B 33/0812 315/185 R |
| 2010/0308739 A1* | 12/2010 | Shteynberg | ............... | H05B 33/083 315/193 |
| 2011/0012530 A1* | 1/2011 | Zheng | ............... | H05B 33/0815 315/294 |
| 2011/0043114 A1* | 2/2011 | Hsu | ............... | H05B 33/0815 315/119 |
| 2011/0062872 A1* | 3/2011 | Jin | ............... | H05B 33/0818 315/122 |
| 2011/0115396 A1* | 5/2011 | Horvath | ............... | H05B 33/0818 315/250 |
| 2012/0081009 A1* | 4/2012 | Shteynberg | ............... | H05B 33/083 315/122 |
| 2012/0161634 A1* | 6/2012 | Kuo | ............... | H05B 33/0827 315/119 |
| 2012/0206146 A1* | 8/2012 | Avenel | ............... | H05B 37/036 324/414 |
| 2013/0038819 A1* | 2/2013 | Ishikawa | ............... | G09G 3/342 349/69 |
| 2013/0049621 A1* | 2/2013 | Yan | ............... | H05B 33/0848 315/205 |
| 2013/0082603 A1* | 4/2013 | Hsu | ............... | H05B 33/0815 315/122 |
| 2013/0250215 A1* | 9/2013 | Sasaki | ............... | H05B 33/0815 349/69 |
| 2013/0257754 A1* | 10/2013 | Liu | ............... | G06F 3/0416 345/173 |
| 2013/0265056 A1* | 10/2013 | Lin | ............... | G01R 31/44 324/414 |
| 2014/0055439 A1* | 2/2014 | Lee | ............... | H05B 37/036 345/212 |
| 2014/0091720 A1* | 4/2014 | Brinlee | ............... | H05B 33/0815 315/186 |
| 2014/0361623 A1* | 12/2014 | Siessegger | ............... | H05B 33/0803 307/64 |
| 2014/0361696 A1* | 12/2014 | Siessegger | ............... | H05B 33/0803 315/186 |
| 2015/0355289 A1* | 12/2015 | Ikawa | ............... | H05B 33/0815 324/414 |

FOREIGN PATENT DOCUMENTS

| | | |
|---|---|---|
| EP | 1338899 A1 | 8/2003 |
| JP | 2010-212369 A | 9/2010 |
| TW | 201242432 A | 10/2012 |
| WO | WO 2012/109471 A2 | 8/2012 |

* cited by examiner

METHOD AND SYSTEM FOR DETECTING LED SHORT CIRCUIT IN LED STRINGS OR DETECTING MATCHING AMONG LED STRINGS

RELATED APPLICATION

This application claims priority to Chinese Patent Application No. 2013100864061 filed Mar. 18, 2013, which is incorporated by reference herein in its entirety.

TECHNICAL FIELD

Embodiments of the present invention relate to the field of LED drive, and more specifically to a method and a system for detecting light emitting diode (LED) short circuit in a plurality of LED strings or detecting matching among the plurality of LED strings.

BACKGROUND

A light emitting diode (briefly called LED) is extensively applied to many environments such as building lighting, vehicle head lamps and tail lamps, backlights and flash lights of liquid crystal display devices including personal computers and high-definition television sets. As compared with conventional light sources such as incandescent lamps and fluorescent lamps, LEDs have distinctive advantages such high efficiency, good directivity, excellent color stability, high reliability, long service life, small size and safe environment.

Generally, a plurality of LEDs are arranged into an LED string, and in many environments, for example, a plurality of LED strings are used in parallel in backlights and flash lights of liquid crystal display devices including personal computers and high-definition television sets.

In use of the LEDs, the corresponding LEDs in each LED string might be short circuited.

Hence, it is desirable to timely, correctly and conveniently detect the short circuit of LEDs in the LED string.

FIG. 1 is a schematic view illustrating detection of LED short circuit in the prior art. For the purpose of brevity, only one LED string 101 is shown. In this prior art, a voltage at a drain of an MOSFET of a switch 102 controlling turn-on or turn-off of the LED string is directly detected and compared with a comparison threshold. If the voltage on the drain is higher than the comparison threshold, it indicates that there are short circuited LEDs in the LED string; if the voltage on the drain is lower than the comparison threshold, it indicates that there are no short circuited LEDs in the LED string.

However, the MOSFET drain is a high-voltage pin, and sometimes its voltage will reach 100 V. Hence, an area of a chip is substantially expanded if units for detecting short circuit of LEDs in the LED string are integrated in a control chip 103. Besides, since there are a plurality of LED strings and each LED string needs to be detected to see whether the LEDs therein are short circuited, the number of pins of the control chip 103 will be increased by detecting the voltage on the MOSFET drain to detect whether there are short circuited LEDs in the corresponding LED strings.

Additionally, due to manufacture differences among LEDs, for the same current, the voltage drops are rather different among the LED strings. In other words, for the same current output, currents might be rather different among the LED strings. This might cause a wrong result in detecting short circuit of LEDs in the LED string. Therefore, before the LED strings are applied to specific environments, it is optimal to perform match detection of the LED strings and to apply matching LED strings, namely, LED strings whose voltage drop difference is less than a comparison threshold, to the same specific environment.

SUMMARY

The disclosure is intended to provide a method and a system for detecting a light emitting diode (LED) short circuit in a plurality of LED strings or detecting matching among the plurality of LED strings, which can address the above-mentioned problems existing in the prior art.

According to one aspect of the present invention, there is provided a system for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the system comprising: a plurality of first current obtaining units, configured to obtain first currents in the LED strings respectively when the output end of the power supply outputs a first voltage; a calculating unit, configured to calculate differences between the minimum of the first currents in each of the LED strings and other first currents; a comparing unit, configured to compare the differences with a comparing threshold; and a determining unit, configured to determine the LED strings corresponding to those other currents for which differences are larger than the comparing threshold to have LED short circuit or mismatch with the LED string corresponding to the minimum current.

According to another aspect of the present invention, there is provided a system for detecting light emitting diode (LED) short circuit in a plurality of LED strings or detecting matching among the plurality of LED strings, wherein one end of each of the plurality of LED strings is connected to a same output end of a power supply, and the other end is respectively connected to corresponding switch, the system comprising: a plurality of first current obtaining units, configured to obtain first currents in the LED strings respectively when the output end of the power supply outputs a first voltage; a changing unit, configured to change the output at the output end of the power supply to a second voltage; a plurality of second current obtaining units, configured to obtain second currents in the LED strings respectively when the output end of the power supply outputs the second voltage; a determining unit, configured to determine whether there is LED short circuit in the LED strings or whether the LED strings matches with one another according to the obtained first and second currents in the LED strings.

According to a further aspect of the present invention, there is provided a method for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the method comprising: obtaining first currents in the LED strings respectively when the output end of the power supply outputs a first voltage; calculating differences between the minimum of the first currents in the LED strings and other first currents; comprising the differences with a comparing threshold; and determining LED strings corresponding to those other currents for which differences are larger than the comparing threshold to have LED short circuit or mismatch with the LED string corresponding to the minimum current.

According to another aspect of the present invention, there is provided a method for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the method comprising: obtaining first currents in the LED strings respectively when the output end of the power supply outputs a first voltage; changing output at the output end of the power supply to a second voltage; obtaining second currents in the LED strings respectively when the output end of the power supply outputs the second voltage; determining whether there is LED short circuit in the LED strings or whether the LED strings match with one another according to the obtained first and second currents in the LED strings.

According to a further aspect of the present invention, there is provided a system for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the system comprising: a plurality of first voltage obtaining units, configured to obtain first voltages at control ends of the corresponding switches respectively when each of the LED strings has a same current; a calculating unit, configured to calculate differences between the maximum of the first voltages at the control ends of the corresponding switches and other first voltages; a comparing unit, configured to compare the differences with a comparing threshold; and a determining unit, configured to determine the LED strings corresponding to those other voltages for which differences are larger than the comparing threshold to have LED short circuit or mismatch with the LED string corresponding to the maximum voltage.

According to a further aspect of the present invention, there is provided a system for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the system comprising: a plurality of first voltage obtaining units, configured to obtain first voltages at control ends of the corresponding switches respectively when each of the LED strings has same current and the output end of the power supply outputs a first voltage; a changing unit, configured to change the output at the output end of the power supply to a second voltage; a plurality of second voltage obtaining units, configured to obtain second voltages at the control ends of the corresponding switches respectively when the output end of the power supply outputs the second voltage; a determining unit, configured to determine whether there is LED short circuit in the LED strings or whether the LED strings match with one another according to the obtained first and second voltages at the control ends of the corresponding switches.

According to a further aspect of the present invention, there is provided a method for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, the method comprising: obtaining first voltages at control ends of the corresponding switches respectively when each of the LED strings has a same current; calculating differences between the maximum of the first voltages at the control ends of the corresponding switches and other voltages; comparing the differences with a comparing threshold; and determining the LED strings corresponding to those other voltages for which differences are larger than the comparing threshold to have LED short circuit or mismatch with a LED string corresponding to the maximum voltage.

According to a further aspect of the present invention, there is provided a method for detecting light emitting diode (LED) short circuit in a plurality of LED strings or detecting matching among the plurality of LED strings, wherein one end of each of the plurality of LED strings is connected to a same output end of power supply, and the other end is respectively connected to a corresponding switch, the method comprising: obtaining first voltages at control ends of the corresponding switches respectively when each of the LED strings has a same current and the output end of the power supply outputs a first voltage; changing the output at the output end of the power supply to a second voltage; obtaining second voltages at the control ends of the corresponding switches respectively when the output end of the power supply outputs the second voltage; determining whether there is LED short circuit in the LED strings or whether the LED strings match with one another according to the obtained first and second voltages at the control end of the corresponding switches.

According to the present invention, it is possible to reduce the number of pins and area of a control chip because there is no need to detect the voltage of a switch terminal which generally exhibits a high voltage, wherein the switch terminal needn't be connected to the control chip in the case of not aiming to detect whether the LED strings have LED short circuit.

BRIEF DESCRIPTION OF THE SEVERAL VIEWS OF THE DRAWINGS

The figures described here are used to provide further understanding of the present application and constitute one part of the present application. Illustrative embodiments of the present invention and depictions thereof are used to illustrate the present invention and do not constitute improper limitations of the present invention. In the figures.

In the figures, the same reference numbers denote the same or like features or functions.

DETAILED DESCRIPTION

Noticeably, in the absence of conflicts, embodiments in the present application and features in the embodiments may be combined with one another. The present invention will be described in detail in combination with embodiments with reference to the figures.

Figure 1:
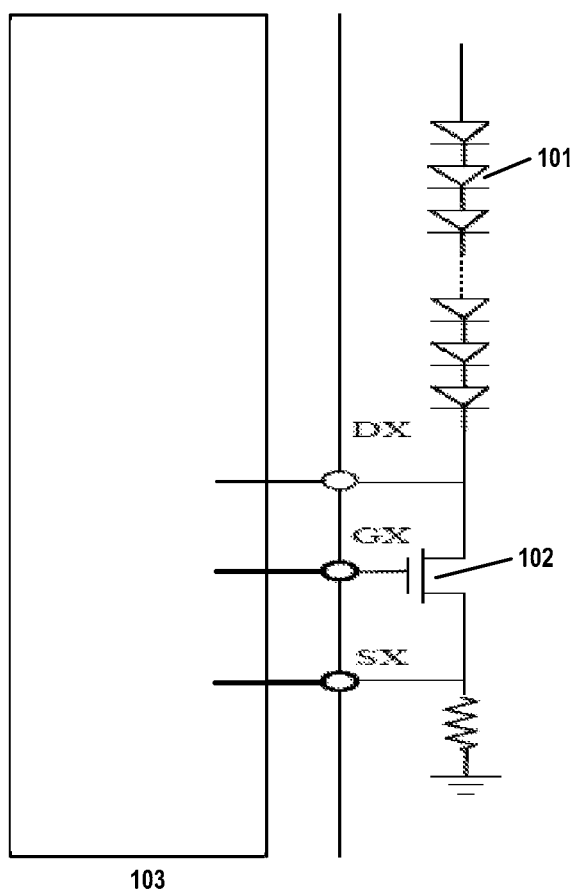
FIG. 1 is a schematic view illustrating detection of LED short circuit according to a conventional system.
Figure 2:
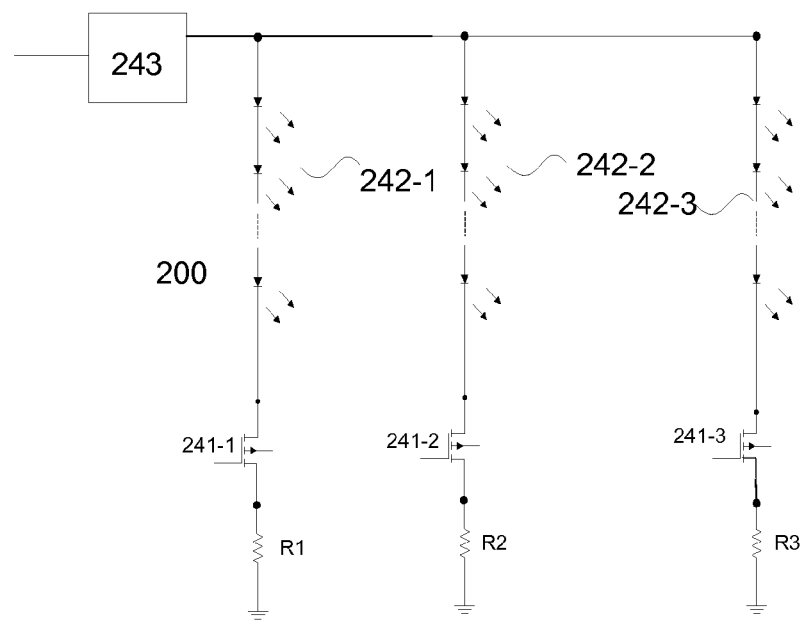
FIG. 2 illustrates an exemplary environment in which the present invention may be implemented.

FIG. 2 illustrates an exemplary environment in which the present invention may be implemented. It will be described in detail hereunder.

An environment 200 comprises a power supply 243, LED strings 242-1, 242-2 and 242-3, switches 241-1, 241-2 and 241-3, and resistors R1, R2 and R3.

The power supply 243 is for example a boost converter and connected to one end of each of the LED strings 242-1, 242-2 and 242-3 to provide an output voltage to the LED strings 242-1, 242-2 and 242-3. In embodiments of the present invention, the output voltage of the power supply 243 is variable, i.e., it may rise or fall.

Certainly, those skilled in the art may understand that the power supply 243 may also be a buck converter or a buck-boost converter.

The other ends of the LED strings 242-1, 242-2 and 242-3 are connected to the corresponding switches 241-1, 241-2 and 241-3, respectively. The switches 241-1, 241-2 and 241-3 may be either an MOSFET, or a bipolar transistor. Here, without loss of generality, assume the switches 241-1, 241-2 and 241-3 to be MOSFETs.

More specifically, the other ends of the LED strings 242-1, 242-2 and 242-3 are connected to drains of the switches 241-1, 241-2 and 241-3 respectively. And sources of the switches 241-1, 241-2 and 241-3 are grounded via the resistors R1, R2 and R3, respectively.

A control signal (not shown in FIG. 2) may be applied respectively to gates of the switches 241-1, 241-2 and 241-3, to control ON and OFF of the switches 241-1, 241-2 and 241-3, such that the ON and OFF of the LED strings 242-1, 242-2 and 242-3 may be controlled.

In the following description, for the purpose of brevity, each of the LED strings 242-1, 242-2 and 242-3 is assumed to have the same number of LEDs.

Noticeably, the number of LED strings according to the present invention is not limited to three. The present invention is also adapted for situations in which the number of LED strings is greater than three or less than three, e.g., two, four, five or six.

Figure 3:
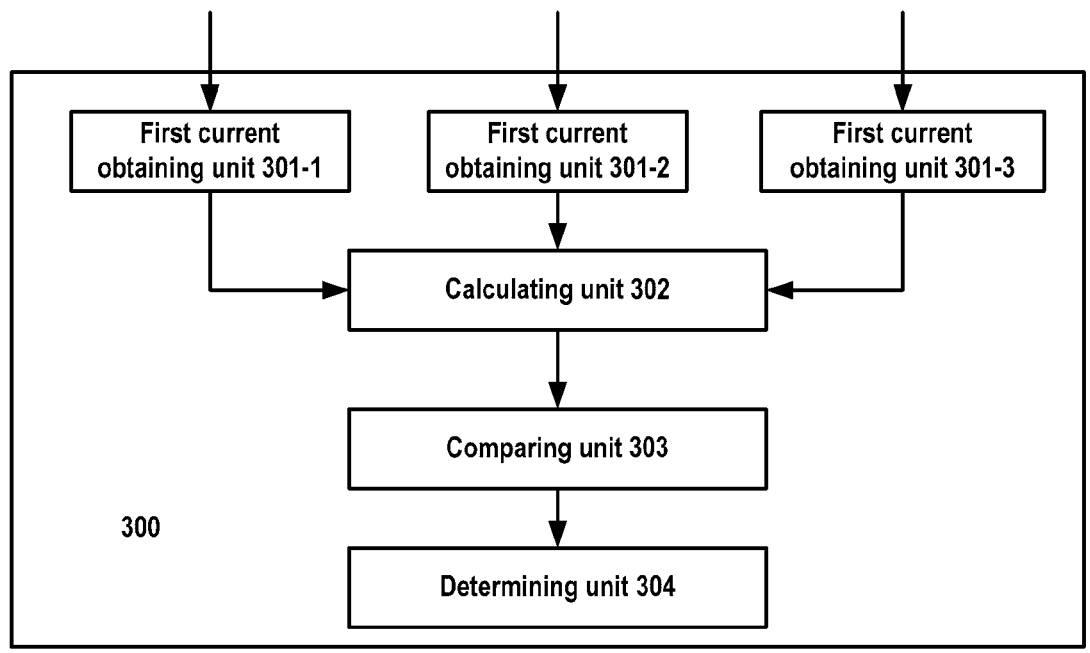
FIG. 3 illustrates a block diagram of a system for detecting LED short circuit in a plurality of LED strings or detecting matching among the plurality of LED strings according to an embodiment of the present invention.

FIG. 3 illustrates a block diagram of a system for detecting LED short circuit in three LED strings shown in FIG. 2 or detecting matching among the three LED strings shown in FIG. 2 according to an embodiment of the present invention.

As shown in FIG. 3, the system 300 comprises three first current obtaining units 301-1, 301-2 and 301-3 for obtaining a respective first current of the LED strings 242-1, 242-2 and 242-3 when the power supply 243 outputs a first voltage;

a calculating unit 302 configured to calculate differences between the minimum of the first currents in each of the LED strings 242-1, 242-2 and 242-3 and other first currents;

a comparing unit 303 configured to compare the differences with a comparing threshold; and a determining unit 304 configured to determine the LED strings corresponding to those other currents for which differences are larger than the comparing threshold to have LED short circuit or mismatch with the LED string corresponding to the minimum current.

Wherein, a magnitude of the comparing threshold corresponds to the number of short circuited LEDs to be detected or to unmatching standards. For example, the above comparing threshold may be set to detect short circuit of one LED, two LEDs or three LEDs. If the above comparing threshold is set to detect short circuit of three LEDs, situations in which one or two LEDs are short circuited are considered as none occurrence of short circuit.

For example, given that the first current of the LED string 242-1 is 110 mA, the first current of the LED string 242-2 be 120 mA, and the first current of the LED string 242-3 be 130 mA.

It can be believed that the LED string corresponding to the minimum current among the first currents, namely, the LED string 242-1, is not short circuited and regarded as a reference for detecting match of the LED strings. Upon knowing general volt-ampere characteristics of each LED and knowing the number of LEDs in each LED string and the output voltage of the power supply, the comparing threshold may be set. For example, without loss of generality, the comparing threshold is 15 mA.

As such, the difference between the first currents of the LED string 242-1 and LED string 242-2 is 10 mA, less than the threshold 15 mA, so it is believed that the LED string 242-2 does not include short circuited LED, and the LED string 242-1 matches the LED string 242-2. In contrast, the difference between the first currents of the LED string 242-1 and LED string 242-3 is 20 mA, larger than threshold 15 mA, so it is believed that the LED string 242-3 includes short circuited LEDs, and the LED string 242-1 does not match the LED string 242-3.

First current obtaining units 301-1, 301-2 and 301-3 obtain the first currents of the respective LED strings in a way of being at the same or substantially same biasing voltage at the gate of the corresponding MOSFET.

According to an embodiment of the present invention, during the obtainment of the first currents of the respective LED strings, the biasing voltage is fixed and invariable, for example, at 5 V. Under the biasing voltage, the corresponding MOSFET is completely on, and an impedance value between its drain and source is very low.

In this embodiment, the first current obtaining units 301-1, 301-2 and 301-3 obtain the first currents of the respective LED strings by sampling the voltage of the source of the corresponding MOSFET.

Besides, according to one embodiment of the present invention, the system 300 may further comprise an analog-digital converter (not shown in FIG. 3) to perform analog-digital conversion for the sampled voltage.

Since the sample voltage is relatively small (e.g., 0-1V), to provide a correct current, the analog-digital conversion may be performed for the sample voltage to obtain for example eight bits, so as to represent one value in a range of 0-255 mA.

According to an embodiment of the present invention, during the obtainment of the first currents of the respective LED strings, the biasing voltage is controllably variable, wherein the biasing voltage varies in a way that the currents of the LED strings are set, wherein the first current of each of the LED strings is the maximum current among the set currents satisfying the biasing voltage under one biasing voltage threshold or between two biasing voltage thresholds.

Figure 4:
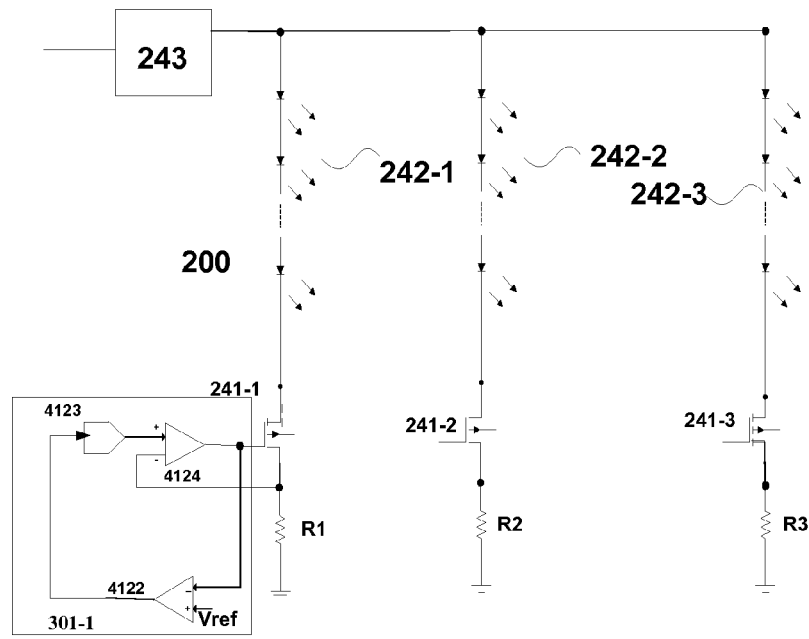
FIG. 4 illustrates a schematic view of a first current obtaining unit according to an embodiment of the present invention.

For the purpose of brevity, FIG. 4 shows the first current obtaining unit 301-1, the biasing voltage of which is controllably variable during the obtainment of the first currents of the respective LED strings.

The first current obtaining units 301-2 and 301-3 are structurally similar.

Specifically, the first current obtaining unit 301-1 comprises a first operational amplifier 4122 in which the inverting input terminal is connected to the gate of the switch 241-1, and the non-inverting input terminal is connected to the biasing threshold (e.g., 4.5 V); a first current digital-analog converter 4123, which is controlled by the output of the first operational amplifier 4122; and a second operational amplifier 4124 in which the non-inverting input terminal is connected to an output terminal of the first digital-analog converter 4123, and the inverting input terminal is connected to a source of the switch 241-1, and the output terminal is connected to a gate of the switch 241-1.

First, a value of the first current digital-analog converter 4123 is set, wherein the current of the LED string 242-1 corresponds to the value of the first current digital-analog converter 4123, the output of the first current digital-analog converter 4123 is set, i.e., the current of the LED string 242-1 is set, and under the value, it is determined whether the voltage of the gate of the switch 241-1 is greater than the biasing voltage threshold (for example, when the voltage at the gate of the switch 241-1 is greater than the biasing voltage threshold, the first operational amplifier 4122 outputs 0; when the voltage at the gate of the switch 241-1 is less than the biasing voltage threshold, the first operational amplifier 4122 outputs 1). If the voltage of the gate is not greater than the biasing voltage threshold, the value outputted by the first current digital-analog converter 4123 is increased (because the increase of the value outputted by the first current digital-analog converter 4123 will cause an increase of the voltage of the gate of the switch 241-1), and then, under the new value, it is determined whether the voltage of the gate of the switch 241-1 is greater than the biasing voltage threshold. The above procedure is continued until the voltage of the gate of the switch 241-1 is equal to or substantially equal to the biasing voltage threshold. The maximum current among the set currents with the biasing voltage being under a biasing voltage threshold is taken as the first current of each of the LED strings.

Besides, although not shown in FIG. 4, those skilled in the art may understand that the first current obtaining unit 301-1 may further comprise another operational amplifier in which an input terminal is connected to the gate of the switch 241-1, the other input terminal is connected to another biasing voltage threshold, e.g., slightly smaller than the above biasing voltage threshold, for example, 4V, and the output terminal controls the first current digital-analog converter 4123 for setting the output of the first current digital-analog converter 4123. In such embodiment, the first current of each of the LED strings is the maximum current among the set currents satisfying that the biasing voltage of the gate is between two biasing voltage thresholds.

Noticeably, the above embodiment only exemplarily describes an embodiment for obtaining the current through the LED string 242-1. In actual application, other embodiments which can achieve this function or effect all should fall within the protection scope of the present invention.

Under the circumstances that the comparing threshold cannot be set, for example, since the general volt-ampere characteristics of each LED are not known, it is impossible to detect LED short circuit in a plurality of LED strings or detect matching among the plurality of LED strings by using the system 300 as described with reference to FIG. 3.

Figure 5:
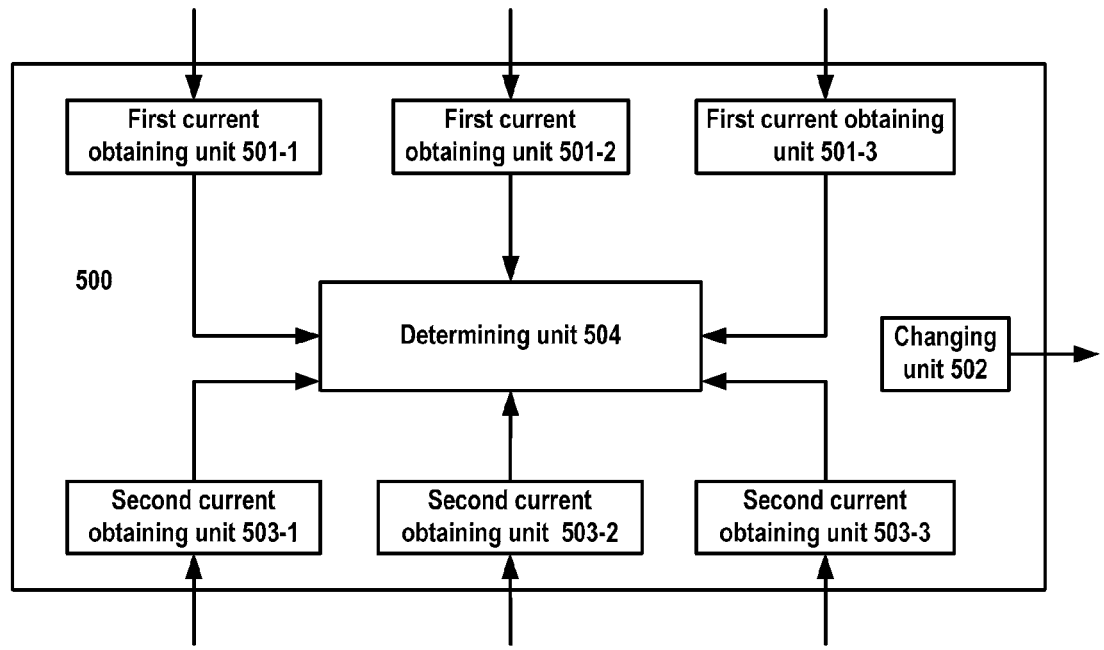
FIG. 5 illustrates a block diagram of a system for detecting LED short circuit in a plurality of LED strings or detecting matching among the plurality of LED strings according to another embodiment of the present invention.

FIG. 5 illustrates a block diagram of a system for detecting LED short circuit in three LED strings shown in FIG. 2 or detecting matching among the three LED strings shown in FIG. 2 according to an embodiment of the present invention. The system 500 can address the problem that cannot be solved by the above system 300.

As shown in FIG. 5, the system 500 comprises: three first current obtaining units 501-1, 501-2 and 501-3 to respectively obtain first currents of the LED strings 242-1, 242-2 and 242-3 when the power supply 243 outputs a first voltage; a changing unit 502, configured to change the output at the output end of the power supply 243 to a second voltage; three second current obtaining units 503-1, 503-2 and 503-3, configured to obtain second currents in each of the LED strings 242-1, 242-2 and 243-3 when the output end of the power supply 243 outputs a second voltage; a determining unit 504, configured to determine whether there is LED short circuit in each of the LED strings 242-1, 242-2 and 242-3 or whether each of the LED strings matches with each other according to the obtained first and second currents in each of the LED strings 242-1, 242-2 and 242-3.

The first current obtaining units 501-1, 501-2 and 501-3 may be identical with the second current obtaining units 503-1, 503-2 and 503-3, and identical with the aforesaid first current obtaining units 301-1, 301-2 and 301-3.

Besides, noticeably, there are two manners for obtaining the first current as stated above. Preferably, the manner for obtaining the second current corresponds to the manner for obtaining the first current.

The second voltage may be higher than the first voltage, or lower than the first voltage, and the difference between the second voltage and the first voltage may be related to for example the number of LEDs for which short circuit is to be detected. Under the circumstance that the second voltage is higher than the first voltage, the determining unit 504 determines that the LED string having the first current larger than the minimum current in the second currents of the respective LED strings has LED short circuit or mismatches.

For example, given that the first voltage is 60 V, the first current of the LED string 242-1 is 100 mA, the first current of the LED string 242-2 is 120 mA, the first current of the LED string 242-3 is 150 mA; when the second voltage is 66V, the second current of the LED string 242-1 is 130 mA, the second current of the LED string 242-2 is 160 mA, the second current of the LED string 242-3 is 200 mA. Then, it is determined that the LED string 242-3 has LED short circuit or mismatches the LED strings 242-1 and 242-2 because its current at the smaller first voltage is larger than the current of the LED string 242-1 at a larger second voltage. If there is no LED short circuit, this situation is substantially impossible.

Likewise, when the second voltage is lower than the first voltage, the determining unit 504 determines that the LED string having the second current larger than the minimum circuit among the first currents of the respective LED strings has LED short circuit or mismatches.

For example, given that first voltage is 60 V, the first current of the LED string 242-1 is 100 mA, the first current of the LED string 242-2 is 120 mA, the first current of the LED string 242-3 is 150 mA; when the second voltage is 54V, the second current of the LED string 242-1 is 75 mA, the second current of the LED string 242-2 is 90 mA, the second current of the LED string 242-3 is 110 mA. Then, it is determined that the LED string 242-3 has LED short circuit or mismatches the LED strings 242-1 and 242-2 because its current at the smaller second voltage is larger than the current of the LED string 242-1 at the larger first voltage. If there is no LED short circuit, this situation is substantially impossible.

The above systems 300 and 500 may be implemented by using hardware (e.g., control chip), or by using software (e.g., computer program code), or even by using software in combination with hardware.

Figure 6:
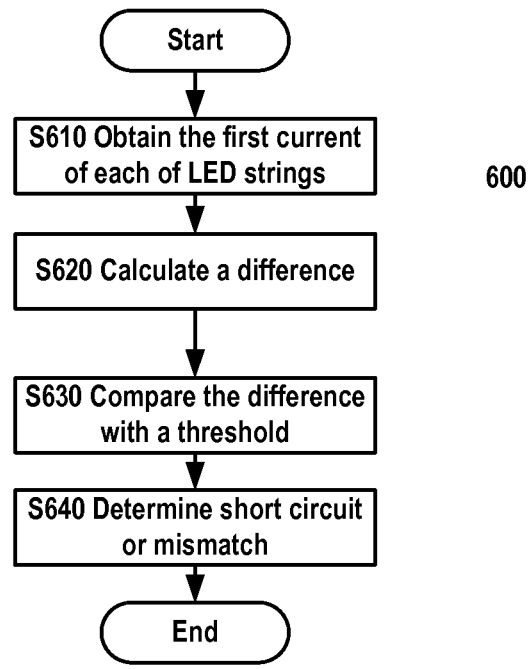
FIG. 6 illustrates a flow chart of a method for detecting LED short circuit in a plurality of LED strings or detecting matching among the plurality of LED strings according to an embodiment of the present invention.

FIG. 6 illustrates a flow chart of a method for detecting LED short circuit in a plurality of LED strings or detecting matching among the plurality of LED strings according to an embodiment of the present invention, wherein one end of each of the plurality of LED strings is connected to a same output end of a power supply, and the other end is respectively connected to a corresponding switch.

As shown in FIG. 6, the method 600 comprises step 610 for obtaining first currents in each of the LED strings when the output end of the power supply outputs a first voltage; step 620 for calculating differences between the minimum current of the first currents in each of the LED strings and other first currents; step 630 for comparing the differences with a comparing threshold; and step S640 for determining LED strings corresponding to those other currents for which differences are larger than the comparing threshold to have LED short circuit or mismatch with the LED string corresponding to the minimum current.

Figure 7:
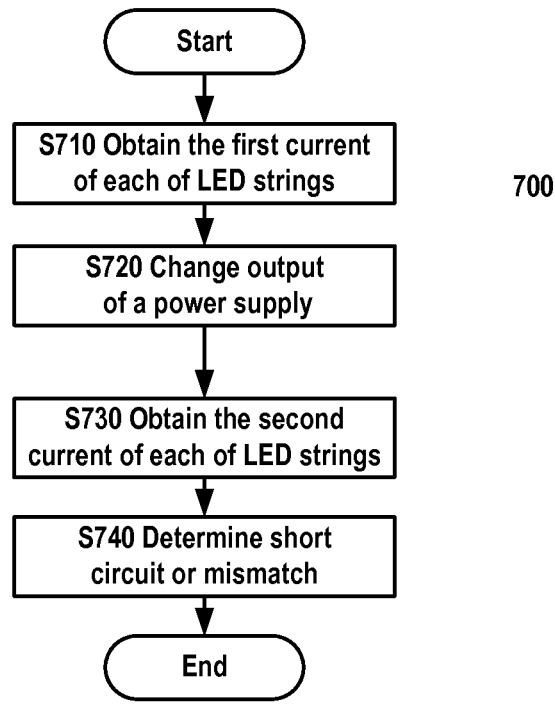
FIG. 7 illustrates a flow chart of a method for detecting LED short circuit in a plurality of LED strings or detecting matching among the plurality of LED strings according to another embodiment of the present invention.

FIG. 7 illustrates a flow chart of a method for detecting LED short circuit in a plurality of LED strings or detecting matching among the plurality of LED strings according to another embodiment of the present invention, wherein one end of each of the plurality of LED strings is connected to a same output end of a power supply, and the other end is respectively connected to a corresponding switch.

As shown in FIG. 7, the method 700 comprises step S710 for obtaining first currents in each of LED strings when the output end of the power supply outputs a first voltage; step S720 for changing output at the output end of the power supply to a second voltage; step S730 for obtaining second currents in each of the LED strings when the output end of the power supply outputs a second voltage; step S740 for determining whether there is LED short circuit in each of the LED strings or whether each of the LED strings matches with each other according to the obtained first and second currents in each of the LED strings.

For the purpose of brevity, in the methods as described in FIG. 6 and FIG. 7, it is assumed that the number of LEDs of each LED string is the same.

According to an embodiment of the present invention, in the method described in FIG. 6 and FIG. 7, the corresponding switch is MOSFET/bipolar transistor, and said other end is respectively connected to the drain of the corresponding MOSFET/a collector of the bipolar transistor.

According to an embodiment of the present invention, in the method described in FIG. 6 and FIG. 7, the first current and second current of the respective LED strings are obtained in a way that the gate of the corresponding MOSFET/a base of the bipolar transistor is under the same biasing voltage.

According to an embodiment of the present invention, in the method described in FIG. 6 and FIG. 7, during the obtainment of the first current and second current of the respective LED strings, the biasing voltage remains invariable, and the first current and second current of the respective LED strings are obtained by sampling a voltage at a source of the corresponding MOSFET/an emitter of the bipolar transistor.

According to an embodiment of the present invention, in the method described in FIG. 6 and FIG. 7, the method further comprises a step of performing analog-digital conversion for the sampled voltage (not shown in the figures).

According to an embodiment of the present invention, in the method described in FIG. 6 and FIG. 7, during the obtainment of the first current and second current of the respective LED strings, the biasing voltage is controllably variable, wherein the biasing voltage varies in a way that the currents of the LED strings are set, wherein the first current and second current of each of the LED strings is the maximum current among the set currents satisfying the biasing voltage under one biasing voltage threshold or between two biasing voltage thresholds.

According to an embodiment of the present invention, in the method described in FIG. 7, the second voltage may be higher than the first voltage, or lower than the first voltage. Under the circumstance that the second voltage is higher than the first voltage, the LED string having the first current larger than the minimum current in the second currents of the respective LED strings is determined to have LED short circuit or mismatch. Under the circumstance that the second voltage is lower than the first voltage, the LED string having the second current larger than the minimum current in the first currents of the respective LED strings is determined to have LED short circuit or mismatch.

According to an embodiment of the present invention, in the method described in FIG. 6, a magnitude of the comparing threshold corresponds to the number of short circuited LEDs to be detected or to unmatching standards.

In all the above embodiments, by setting the biasing voltage at the gates of the respective switches to be identical, whether the LEDs in each LED string have short circuit or whether all LED strings match is determined by measuring the current (the first current or the second current) in respective LED string.

In all the following embodiments, by setting the current in respective LED string to be identical, whether the LEDs in each LED string have short circuit or whether all LED strings match is determined by measuring the voltage (the first voltage or second voltage) of the gates of the corresponding MOSFETs of all LED strings.

Figure 8:
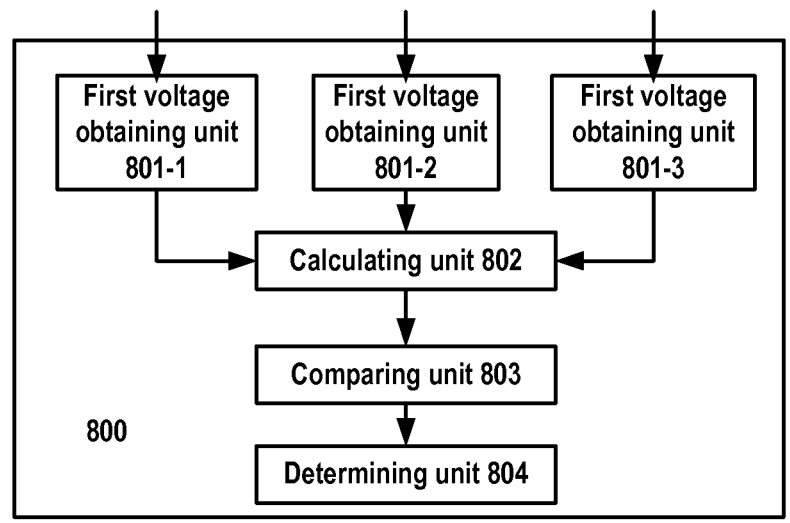
FIG. 8 illustrates a block diagram of a system for detecting LED short circuit in a plurality of LED strings or detecting matching among the plurality of LED strings according to a further embodiment of the present invention.

FIG. 8 illustrates a block diagram of a system for detecting LED short circuit in three LED strings shown in FIG. 2 or detecting matching among the three LED strings shown in FIG. 2 according to an embodiment of the present invention.

As shown in FIG. 8, the system 800 comprises three first voltage obtaining units 801-1, 801-2, 801-3 for obtaining first voltages at control ends of the corresponding switches 241-1, 241-2, 241-3 when each of the LED strings 242-1, 242-2, 242-3 has same current;

a calculating unit 802, configured to calculate differences between the maximum of the first voltages at the control ends of the corresponding switches 241-1, 241-2, 242-3 and other first voltages;

a comparing unit 803, configured to compare the differences with a comparing threshold; and a determining unit 804, configured to determine the LED strings corresponding to those other voltages for which differences are larger than the comparing threshold to have LED short circuit or mismatch with the LED string corresponding to the maximum voltage.

A magnitude of the comparing threshold corresponds to the number of short circuited LEDs to be detected or to unmatching standards. For example, the above comparing threshold may be set to detect short circuit of one LED, two LEDs or three LEDs. If the above comparing threshold is set to detect short circuit of three LEDs, situations in which one or two LEDs are short circuited are considered as none occurrence of short circuit.

For example, given that the first voltage of the gate of the MOSFET 241-1 of the LED string 242-1 is 4.4V, the first voltage of the gate of the MOSFET 241-2 of the LED string 242-2 is 4.2V, and the first voltage of the gate of the MOSFET 241-3 of the LED string 242-3 is 4.0 V.

It can be believed that the LED string corresponding to the maximum voltage among the first voltages of the gates, namely, the LED string 242-1, is not short circuited and regarded as a reference for detecting matching of the LED strings. Upon knowing general volt-ampere characteristics of each LED and knowing the number of LEDs in each LED string and the output voltage of the power supply, the comparing threshold may be set. For example, without loss of generality, the comparing threshold is 0.3V.

As such, the difference between the first voltages of the gates of the MOSFETs of the LED string 242-1 and LED string 242-2 is 0.2V, less than the threshold 0.3V, so it is believed that the LED string 242-2 does not include short circuited LED, and the LED string 242-1 matches the LED string 242-2. In contrast, the difference between the first voltages of the gates of the MOSFETs of the LED string 242-1 and LED string 242-3 is 0.4V, larger than threshold 0.3V, so it is believed that the LED string 242-3 includes short circuited LEDs, and the LED string 242-1 does not match the LED string 242-3.

First voltage obtaining units 801-1, 801-2 and 801-3 may obtain the corresponding first voltages by sampling the voltages at the gates of MOSFETs 241-1, 241-2, 241-3 (e.g., using an analog-digital converter).

Figure 9:
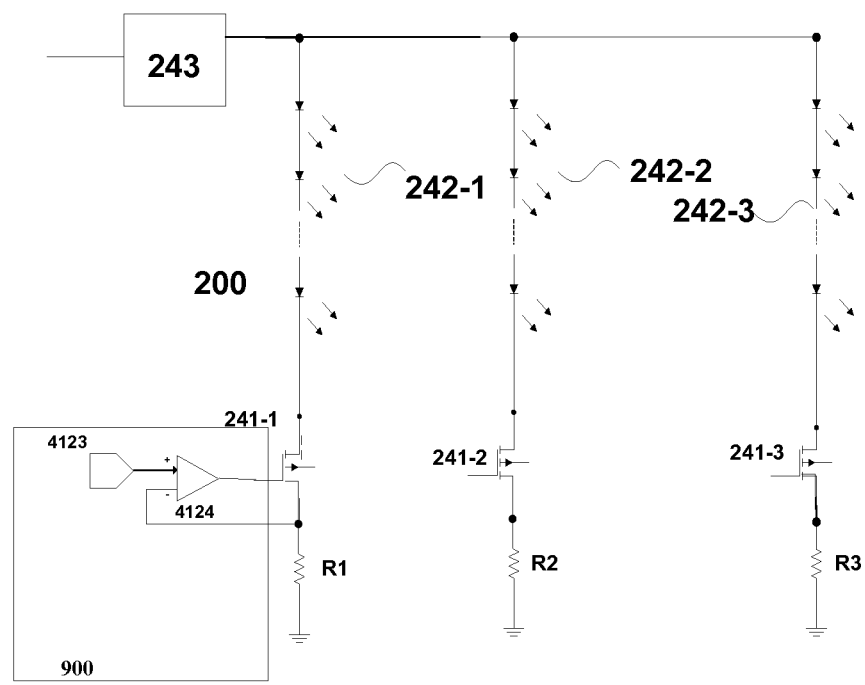
FIG. 9 illustrates a schematic view of a current arranging unit according to an embodiment of the present invention.

Besides, a current arranging unit shown in FIG. 9 may be used to enable the LED strings 242-1, 242-2, 242-3 all in the same first current.

The current arranging unit 900 differs from the first current obtaining unit 301-1 shown in FIG. 4 in that the first operational amplifier 4122 and its relevant connection lines are omitted.

Under the circumstances that the comparing threshold cannot be set, for example, since the general volt-ampere characteristics of each LED are not known, it is impossible to detect LED short circuit in a plurality of LED strings or detect matching among the plurality of LED strings by using the system 800 as described with reference to FIG. 8.

Figure 10:
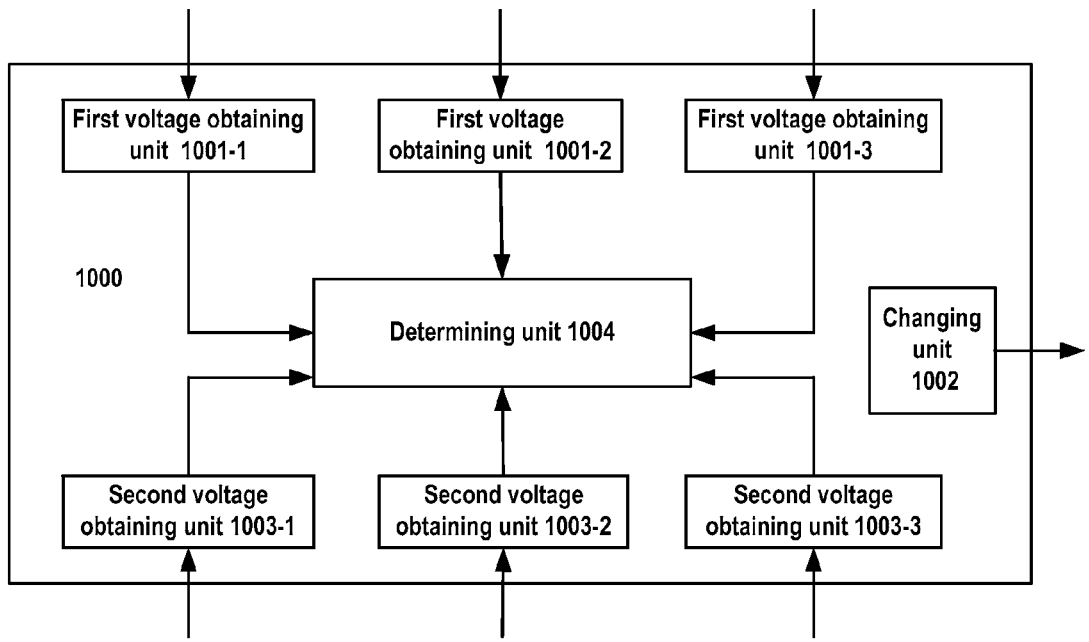
FIG. 10 illustrates a block diagram of a system for detecting LED short circuit in a plurality of LED strings or detecting matching among the plurality of LED strings according to another embodiment of the present invention.

FIG. 10 illustrates a block diagram of a system for detecting LED short circuit in three LED strings shown in FIG. 2 or detecting matching among the three LED strings shown in FIG. 2 according to an embodiment of the present invention. The system 1000 can address the problem that cannot be solved by the above system 800.

As shown in FIG. 10, the system 1000 comprises three first voltage obtaining units 1001-1, 1001-2, 1001-3 for obtaining first voltages at the gates of the corresponding MOSFETs 241-1, 241-2, 241-3 when each of the LED strings has same current and the output end of the power supply 243 outputs a first voltage;

a changing unit 1002, configured to change the output at the output end of the power supply to a second voltage;

three second voltage obtaining units 1003-1, 1003-2, 1003-3, configured to obtain second voltages at the gates of the corresponding MOSFETs 241-1, 241-2, 241-3 when the output end of the power supply 243 outputs a second voltage;

a determining unit 1004, configured to determine whether there is LED short circuit in each of the LED strings or whether each of the LED strings matches with each other according to the obtained first and second voltages of the gates of the corresponding MOSFETs 241-1, 241-2, 241-3.

The first voltage obtaining units 1001-1, 1001-2 and 1001-3 may be identical with the second current obtaining units 1003-1, 1003-2 and 1003-3, and identical with the aforesaid first voltage obtaining units 801-1, 801-2 and 801-3.

The second voltage outputted by the output end of the power supply 243 may be higher or lower than the first voltage outputted by the output end of the power supply 243, and the difference between the second voltage outputted by the output end of the power supply 243 and the first voltage outputted by the output end of the power supply 243 may be related to for example the number of LEDs for which short circuit is to be detected. Under the circumstance that the second voltage outputted by the output end of the power supply 243 is lower than the first voltage outputted by the output end of the power supply 243, the determining unit 1004 determines that the LED string whose switch control end has the second voltage lower than the maximum voltage among first voltages of control ends of corresponding switches has LED short circuit or mismatches.

For example, given that the first voltage outputted by the output end of the power supply 243 is 66V, the first voltage of the gate of MOSFET 241-1 of the LED string 242-1 is 4.5 V, the first voltage of the gate of MOSFET 241-2 of the LED string 242-2 is 4.3V, and the first voltage of the gate of MOSFET 241-3 of the LED string 242-3 is 4.1V; in the case that the second voltage outputted by the output end of the power supply 243 is 60 V, the second voltage of the gate of MOSFET 241-1 of the LED string 242-1 is 4.8V, the second voltage of the gate of MOSFET 241-2 of the LED string 242-2 is 4.6V, and the second voltage of the gate of MOSFET 241-3 of the LED string 242-3 is 4.4V. Then, it is determined that the LED string 242-3 has LED short circuit or mismatches the LED strings 242-1 and 242-2 because its MOSFET gate voltage under a smaller second voltage outputted by the output end of the power supply 243, is smaller than the voltage of the gate of MOSFET of the LED string 242-1 under a larger first voltage outputted by the output end of the power supply 243. If there is no LED short circuit, this situation is substantially impossible.

Likewise, when the second voltage outputted by the output end of the power supply 243 is higher than the first voltage outputted by the output end of the power supply 243, the determining unit 1004 determines that the LED string whose switch control end has the first voltage lower than the maximum voltage among second voltages of control ends of corresponding switches has LED short circuit or mismatches.

For example, given that the first voltage outputted by the output end of the power supply 243 is 66V, the first voltage of the gate of MOSFET 241-1 of the LED string 242-1 is 4.8V, the first voltage of the gate of MOSFET 241-2 of the LED string 242-2 is 4.6V, and the first voltage of the gate of MOSFET 241-3 of the LED string 242-3 is 4.4V; in the case that the second voltage outputted by the output end of the power supply 243 is 72V, the second voltage of the gate of MOSFET 241-1 of the LED string 242-1 is 4.5 V, the second voltage of the gate of MOSFET 241-2 of the LED string 242-2 is 4.3V, and the second voltage of the gate of MOSFET 241-3 of the LED string 242-3 is 4.1V. Then, it is determined that the LED string 242-3 has LED short circuit or mismatches the LED strings 242-1 and 242-2 because the voltage of its switch control end under a smaller first voltage outputted by the output end of the power supply 243, is smaller than the voltage of the control end of the switch of the LED string 242-1 under a larger second voltage outputted by the output end of the power supply 243. If there is no LED short circuit, this situation is substantially impossible.

The above systems 800 and 1000 may be implemented by using hardware (e.g., control chip), or by using software (e.g., computer program code), or even by using software in combination with hardware.

Figure 11:
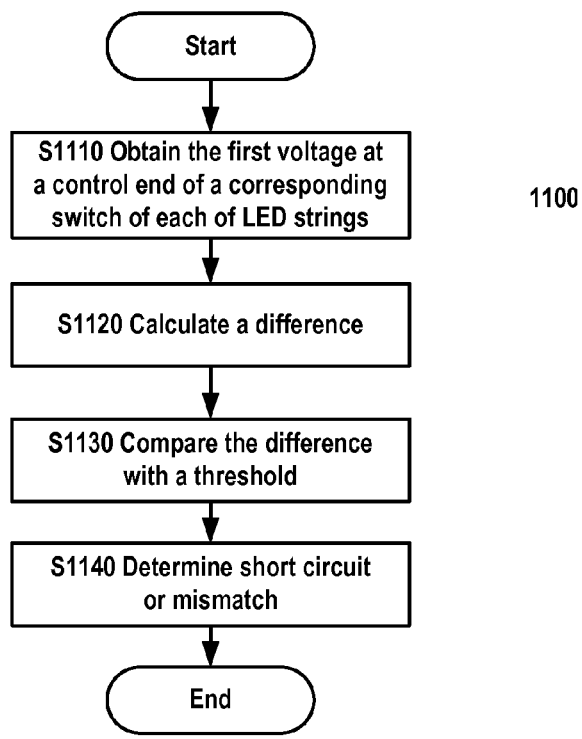
FIG. 11 illustrates a flow chart of a method for detecting LED short circuit in a plurality of LED strings or detecting matching among the plurality of LED strings according to an embodiment of the present invention.

FIG. 11 illustrates a flow chart of a method for detecting LED short circuit in a plurality of LED strings or detecting matching among the plurality of LED strings according to an embodiment of the present invention, wherein one end of each of the plurality of LED strings is connected to a same output end of a power supply, and the other end is respectively connected to a corresponding switch.

As shown in FIG. 11, the method 1100 comprises the following steps: step 1110 for obtaining first voltages at control ends of the corresponding switches when each of the LED strings has same current; step S1120 for calculating differences between the maximum of the first voltages at the control ends of the corresponding switches and other voltages; steps S1130 for comparing the differences with a comparing threshold; and step 1140 for determining the LED strings corresponding to those other voltages for which differences are larger than the comparing threshold to have LED short circuit or mismatch with a LED string corresponding to the maximum voltage.

Figure 12:
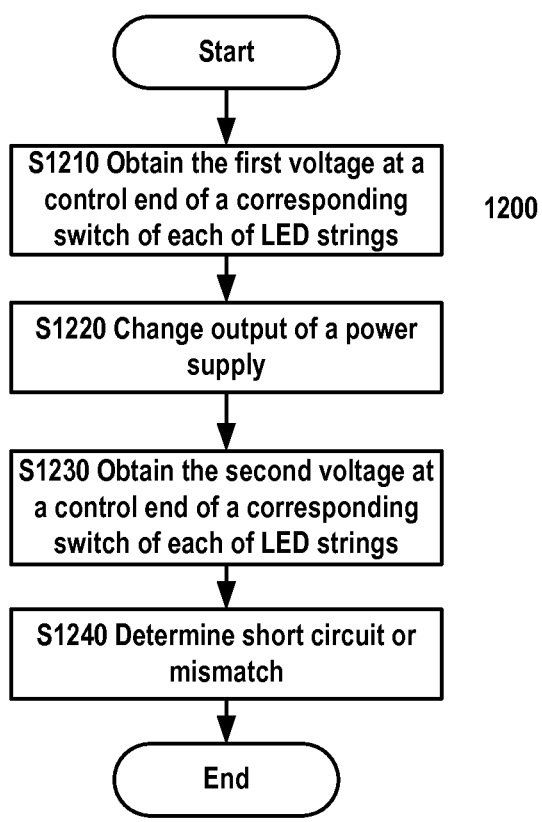
FIG. 12 illustrates a flow chart of a method for detecting LED short circuit in a plurality of LED strings or detecting matching among the plurality of LED strings according to another embodiment of the present invention.

FIG. 12 illustrates a flow chart of a method for detecting LED short circuit in a plurality of LED strings or detecting matching among the plurality of LED strings according to another embodiment of the present invention, wherein one end of each of the plurality of LED strings is connected to a same output end of power supply, and the other end is respectively connected to a corresponding switch.

As shown in FIG. 12, the method 1200 comprises the following steps: step 1210 for obtaining first voltages at control ends of the corresponding switches when each of the LED strings has same current and the output end of the power supply outputs a first voltage; step S1220 for changing the output at the output end of the power supply to a second voltage; step S1230 for obtaining second voltages at the control ends of the corresponding switches when the output end of the power supply outputs a second voltage; and step S1240 for determining whether there is LED short circuit in each of the LED strings or whether each of the LED strings matches with each other according to the obtained first and second voltages at the control end of the corresponding switches.

For the purpose of brevity, in the methods as described in FIG. 11 and FIG. 12, it is assumed that the number of LEDs of each LED string is the same.

According to an embodiment of the present invention, in the methods described in FIG. 11 and FIG. 12, the corresponding switch is MOSFET/bipolar transistor, and the other end is respectively connected to the drain of the corresponding MOSFET/a collector of the bipolar transistor, and the control end is the gate of the corresponding MOSFET/a base of the bipolar transistor.

According to an embodiment of the present invention, in the method described in FIG. 12, the second voltage outputted by the output end of the power supply may be higher or lower than the first voltage outputted by the output end of the power supply. Under the circumstance that the second voltage outputted by the output end of the power supply is lower than the first voltage outputted by the output end of the power supply, the LED string whose switch control end has the second voltage lower than the maximum voltage among first voltages of control ends of corresponding switches, has LED short circuit or mismatches; under the circumstance that the second voltage outputted by the output end of the power supply is higher than the first voltage outputted by the output end of the power supply, the LED string whose switch control end has the first voltage lower than the maximum voltage among second voltages of the corresponding switches, has LED short circuit or mismatches.

According to an embodiment of the present invention, in the method described in FIG. 11, a magnitude of the comparing threshold corresponds to the number of short circuited LEDs to be detected or to unmatching standards.

In any embodiment as described above, a LED also refers to an organic LED (organic light-emitting diode). An OLED a light-emitting diode in which the emissive electroluminescent layer is a film of organic compound which emits light in response to an electric current. This layer of organic semiconductor is situated between two electrodes. In addition, all or a portion of the switches (e.g., MOSFETs or bipolar transistors) may be either external or internal to a device (e.g., a chip or die). In some examples, the switched are integrated into a high voltage or low voltage device.

What are described are only preferred embodiments of the present invention, and not intended to limit the present invention. Those skilled in the art appreciate that the present invention may have various modifications and variations. Any modifications, equivalent substitutes and improvements within the spirit and principles of the present invention all fall within the protection scope of the present invention.

The invention claimed is:

1. A system for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding drain/collector of a corresponding switch, and wherein a corresponding source/emitter of the corresponding switch is connected to ground via a corresponding resistor, the system comprising:
   a plurality of first current obtaining units, configured to obtain first currents in the LED strings respectively when the output end of the power supply outputs a first voltage, wherein each of the plurality of first current obtaining units obtains a corresponding one of the first currents based upon a voltage on a corresponding source/emitter of a corresponding switch;
   a changing unit, configured to change the output at the output end of the power supply to a second voltage;

a plurality of second current obtaining units, configured to obtain second currents in the LED strings respectively when the output end of the power supply outputs the second voltage, wherein each of the plurality of second current obtaining units obtains a corresponding one of the second currents based upon a voltage on a corresponding source/emitter of a corresponding switch;

a determining unit, configured to determine, based upon the obtained first and second currents in the LED strings, whether there is LED short circuit in the LED strings or whether the LED strings match one another.

2. The system according to claim 1, wherein the switches comprise MOSFETs or bipolar transistors, and said other end is connected to drains of respective MOSFETs or collectors of respective bipolar transistors.

3. The system according to claim 2, wherein the plurality of first current obtaining units and the plurality of second current obtaining units obtain the first currents and second currents of respective LED strings in a way of being at one biasing voltage at gates of the respective MOSFETs or bases of the respective bipolar transistors.

4. The system according to claim 3, wherein during obtainment of the first currents and second currents of the respective LED strings, the biasing voltage remains constant, and each of the first current and second current of the respective LED strings is obtained by sampling a voltage at a source of a corresponding MOSFET or an emitter of a corresponding bipolar transistor.

5. The system according to claim 4, further comprising: an analog-digital converter to perform analog-digital conversion for the sampled voltage.

6. The system according to claim 3, wherein during obtainment of the first currents and second currents of the respective LED strings, the biasing voltage is controlled to vary, wherein the biasing voltage varies in a way that the currents of the LED strings are set, wherein the first current and second current of each of the LED strings are respective maximum currents among the set currents satisfying the biasing voltage below one biasing voltage threshold or between two biasing voltage thresholds.

7. The system according to claim 1, wherein the second voltage may be higher than the first voltage or lower than the first voltage; under the circumstance that the second voltage is higher than the first voltage, the determining unit determines that the LED string having a first current larger than a minimum second current of the respective LED strings includes LED short circuit or mismatch; under the circumstance that the second voltage is lower than the first voltage, the determining unit determines that the LED string having a second current larger than a minimum first current of the respective LED strings includes LED short circuit or mismatch.

8. A method for detecting light emitting diode (LED) short circuit in a plurality of LED strings or detecting matching among the plurality of LED strings, wherein one end of each of the plurality of LED strings is connected to a same output end of a power supply, and the other end is respectively connected to a corresponding switch, and wherein a corresponding source/emitter of the corresponding switch is connected to ground via a corresponding resistor, the method comprising:

obtaining, by a plurality of first current obtaining units, first currents in the LED strings respectively when the output end of the power supply outputs a first voltage, wherein each of the plurality of first current obtaining units obtains a corresponding one of the first currents based upon a voltage on a corresponding source/emitter of a corresponding switch;

changing output at the output end of the power supply to a second voltage;

obtaining, by a plurality of second current obtaining units, second currents in the LED strings respectively when the output end of the power supply outputs the second voltage, wherein each of the plurality of second current obtaining units obtains a corresponding one of the second currents based upon a voltage on a corresponding source/emitter of a corresponding switch;

based upon the obtained first and second currents in the LED strings, determining whether there is LED short circuit in the LED strings or whether the LED strings match with one another.

9. The method according to claim 8, wherein the switches comprise MOSFETs or bipolar transistors, and said other end is connected to drains of respective MOSFETs or collectors of respective bipolar transistors.

10. The method according to claim 9, wherein the first currents and second currents of respective LED strings are obtained in a way of being at one biasing voltage at gates of the respective MOSFETs or bases of the respective bipolar transistors.

11. The method according to claim 10, wherein during obtainment of the first currents and second currents of the respective LED strings, the biasing voltage remains constant, and each of the first current and second current of the respective LED strings is obtained by sampling a voltage at a source of a corresponding MOSFET or an emitter of a corresponding bipolar transistor.

12. The method according to claim 11, further comprising: performing analog-digital conversion for the sampled voltage.

13. The method according to claim 10, wherein during obtainment of the first currents and second currents of the respective LED strings, the biasing voltage is controlled to vary, wherein the biasing voltage varies in a way that the currents of the LED strings are set, wherein the first current and second current of each of the LED strings are respective maximum currents among the set currents satisfying the biasing voltage below one biasing voltage threshold or between two biasing voltage thresholds.

14. The method according to claim 8, wherein the second voltage may be higher than the first voltage or lower than the first voltage; under the circumstance that the second voltage is higher than the first voltage, it is determined that the LED string having a first current larger than a minimum second current of the respective LED strings includes LED short circuit or mismatch; under the circumstance that the second voltage is lower than the first voltage, it is determined that a LED string having a second current larger than a minimum first current of the respective LED strings includes LED short circuit or mismatch.

* * * * *